(12) United States Patent
Arakawa et al.

(10) Patent No.: US 9,170,418 B2
(45) Date of Patent: Oct. 27, 2015

(54) VARIABLE WAVELENGTH INTERFERENCE FILTER, OPTICAL MODULE, OPTICAL ANALYSIS DEVICE, AND METHOD FOR MANUFACTURING VARIABLE WAVELENGTH INTERFERENCE FILTER

(75) Inventors: Katsuji Arakawa, Chino (JP); Nozomu Hirokubo, Fujimi (JP); Hiroshi Komatsu, Shimosuwa (JP)

(73) Assignee: Seiko Epson Corporation (JP)

( * ) Notice: Subject to any disclaimer, the term of this patent is extended or adjusted under 35 U.S.C. 154(b) by 535 days.

(21) Appl. No.: 13/368,625

(22) Filed: Feb. 8, 2012

(65) Prior Publication Data

US 2013/0038876 A1 Feb. 14, 2013

(30) Foreign Application Priority Data

Feb. 9, 2011 (JP) ................................. 2011-026146

(51) Int. Cl.
*G02B 26/00* (2006.01)
*B81B 7/00* (2006.01)
*G01J 3/26* (2006.01)

(52) U.S. Cl.
CPC ............ *G02B 26/001* (2013.01); *B81B 7/0035* (2013.01); *G01J 3/26* (2013.01)

(58) Field of Classification Search
CPC .... G02B 5/284; G02B 6/29358; G02B 26/00; G02B 26/001; B81B 7/0032–7/0077; G01J 3/26
USPC ................. 359/237–237, 260, 290–291, 295, 359/577–590; 356/450–521; 156/99–109
See application file for complete search history.

(56) References Cited

U.S. PATENT DOCUMENTS

| | | | |
|---|---|---|---|
| 6,356,689 B1 | 3/2002 | Greywall | |
| 2005/0057331 A1* | 3/2005 | Murata | ........................... 335/78 |
| 2006/0018348 A1 | 1/2006 | Przybyla et al. | |
| 2006/0183644 A1 | 8/2006 | Nakamura et al. | |
| 2007/0171530 A1* | 7/2007 | Nakamura | ................... 359/580 |
| 2007/0171531 A1 | 7/2007 | Nakamura | |
| 2007/0241451 A1 | 10/2007 | Koizumi et al. | |

(Continued)

FOREIGN PATENT DOCUMENTS

| | | |
|---|---|---|
| JP | 2005-309174 | 11/2005 |
| JP | 2007-287967 A | 11/2007 |

(Continued)

OTHER PUBLICATIONS

Extended European Search Report for Application No. 12 15 4184 mailed May 11, 2012 (8 pages).

*Primary Examiner* — Stephone B Allen
*Assistant Examiner* — Kimberly N Kakalec
(74) *Attorney, Agent, or Firm* — Harness, Dickey & Pierce, P.L.C.

(57) ABSTRACT

A variable wavelength interference filter includes a first substrate having a fixed mirror, a second substrate bonded to the first substrate and having a movable portion and a movable mirror fixed to the movable portion, a third substrate bonded to the second substrate on the side opposite to the first substrate, and an electrostatic actuator which displaces the movable portion in a substrate thickness direction, wherein a penetration hole connecting a light exiting-side space between the first substrate and the second substrate and a light incident-side space between the second substrate and the third substrate to a space outside the filter is formed, and the penetration hole is sealed with a sealant which tightly closes each space in a reduced-pressure state.

10 Claims, 7 Drawing Sheets

(56) References Cited

U.S. PATENT DOCUMENTS

| | | |
|---|---|---|
| 2010/0103403 A1 | 4/2010 | Ishizuka |
| 2010/0142067 A1* | 6/2010 | Hanamura et al. ............ 359/850 |
| 2010/0290102 A1* | 11/2010 | Lan .............................. 359/290 |
| 2010/0302660 A1 | 12/2010 | Hirokubo et al. |
| 2014/0078588 A1 | 3/2014 | Funasaka |

FOREIGN PATENT DOCUMENTS

| | | |
|---|---|---|
| JP | 2007-299008 | 11/2007 |
| JP | 2008-061313 | 3/2008 |
| JP | 2008-091417 | 4/2008 |
| JP | 2008-114319 | 5/2008 |
| JP | 2008-129074 A | 6/2008 |
| JP | 2009-134028 | 6/2009 |
| JP | 2010-122207 A | 6/2010 |
| JP | 2010-181648 A | 8/2010 |
| JP | 2010-204457 A | 9/2010 |
| JP | 2011-008225 A | 1/2011 |
| WO | 2007-120885 | 10/2007 |

* cited by examiner

VARIABLE WAVELENGTH INTERFERENCE FILTER, OPTICAL MODULE, OPTICAL ANALYSIS DEVICE, AND METHOD FOR MANUFACTURING VARIABLE WAVELENGTH INTERFERENCE FILTER

BACKGROUND

1. Technical Field

The present invention relates to a variable wavelength interference filter which selects light of a desired target wavelength from incident light and emits the selected light, an optical module including this variable wavelength interference filter, an optical analysis device including this optical module, and a method for manufacturing the variable wavelength interference filter.

2. Related Art

In the related art, a spectral filter is known which acquires light of a specific wavelength from incident light by reflecting light between a pair of reflection mirrors, transmitting light of a specific wavelength and canceling light of other wavelengths by interference. Also, as one such spectral filter, a variable wavelength interference filter is known which selects and emits light to be emitted by adjusting the distance between the mirrors (see, for example, JP-A-2007-299008).

The variable wavelength interference filter described in JP-A-2007-299008 includes a fixed mirror formed on an SOI (silicon on insulator) substrate, and a movable mirror having a penetration hole and arranged to face the fixed mirror. In this variable wavelength interference filter, air resistance generated by air compression at the time of driving is relaxed (mitigated) via the penetration hole of the movable mirror, thus restraining vibration of the movable mirror.

However, in the variable wavelength interference filter described in JP-A-2007-299008, an internal space which houses a movable portion at atmospheric-pressure and the movable mirror receives air resistance at the time of driving. Therefore, there is a problem in that sufficient responsiveness of the movable mirror cannot be secured because of the air resistance.

SUMMARY

An advantage of some aspects of the invention is that a variable wavelength interference filter, an optical module, an optical analysis device and a method for manufacturing a variable wavelength interference filter are provided in which responsiveness of a movable mirror can be improved.

An aspect of the invention is directed to a variable wavelength interference filter including: a light-transmissive first substrate; a light-transmissive second substrate which faces one surface side of the first substrate and is bonded to the first substrate; a light-transmissive third substrate which faces a side of the second substrate opposite to the side where the first substrate is provided, and which is bonded to the second substrate; a movable portion provided in the second substrate and having a movable surface that faces the first substrate; a connection holding portion provided in the second substrate and holding the movable portion movably in a substrate thickness direction; a pair of mirrors arranged facing each other via a predetermined inter-mirror gap on the movable surface of the movable portion and a surface of the first substrate on the side of the second substrate; and an electrostatic actuator which has a pair of displacement electrodes facing each other, on the surfaces facing each other of the first substrate and the second substrate, and displaces the movable portion in the substrate thickness direction by electrostatic attraction as a predetermined voltage is applied to the displacement electrodes. The first substrate and the second substrate, and the second substrate and the third substrate, are bonded respectively by a ring-shaped bonding layer. A first internal space sandwiched by the first substrate and the second substrate, and a second internal space sandwiched by the second substrate and the third substrate are provided. A penetration hole through which the first internal space and the second internal space are connected to an exterior space outside of the filter is formed. The penetration hole is sealed with a sealant which tightly closes the first internal space and the second internal space in a reduced-pressure state below atmospheric pressure.

According to this aspect of the invention, the penetration hole is formed which connects the first internal space sandwiched by the first substrate and the second substrate and the second internal space sandwiched by the second substrate and the third substrate to an outside space. The penetration hole is sealed with the sealant and each internal space is tightly closed in the reduced-pressure state. In this case, the reduced-pressure state below atmospheric pressure can be achieved in the internal spaces, for example, by connecting the penetration hole to a vacuum pump and sucking (evacuating) the air from each internal space. Therefore, each internal space can be sealed in the reduced-pressure state after the substrates are bonded. Thus, since the movable portion provided with the mirror is arranged in the internal space of the reduced-pressure state, the action of air resistance on the movable mirror at the time of driving can be prevented. Therefore, the responsiveness of the movable mirror can be improved and sufficient responsiveness of the movable mirror can be secured.

Moreover, since the substrates can be bonded at atmospheric-pressure, a bonding method using a plasma polymerized film, metal film or the like can be employed and the bonding quality of the individual substrates can be secured.

In the variable wavelength interference filter according to the above aspect of the invention, it is preferable that the penetration hole includes a first penetration hole formed in the first substrate and connecting the first internal space to a space outside of the substrate, and a second penetration hole formed in the second substrate and connecting the first internal space with the second internal space, and that the first penetration hole is sealed with the sealant.

According to this configuration, since the first penetration hole connected to the first internal space is formed in the first substrate and the second penetration hole connecting the first internal space with the second internal space is formed in the second substrate, a reduced-pressure state below atmospheric pressure can be achieved in each internal space by air suction through the first penetration hole. Thus, each internal space can be sealed in the reduced-pressure state by simply sealing the first penetration hole and therefore a small number and amount of sealants suffices.

In the variable wavelength interference filter according to the above aspect of the invention, it is preferable that the penetration hole includes a first penetration hole formed in the first substrate and connecting the first internal space to a space outside of the substrate, and a third penetration hole formed in the third substrate and connecting the second internal space to the space outside of the substrate, and that the first penetration hole and the third penetration hole are sealed with the sealant.

According to this configuration, since the first penetration hole connected to the first internal space is formed in the first substrate and the third penetration hole connected to the second internal space is formed in the third substrate, air within each internal space can be evacuated separately. Therefore, the time for achieving a reduced-pressure state in each internal space can be reduced and manufacturing efficiency of the variable wavelength interference filter can be improved.

In the variable wavelength interference filter according to the above aspect of the invention, it is preferable that the pair of displacement electrodes includes a first displacement electrode provided on the first substrate and a second displacement electrode provided on the second substrate, that a first penetration electrode penetrating the first substrate and connected to the first displacement electrode and a second penetration electrode penetrating the first substrate are formed in the first substrate, and that a bump electrode connecting the second penetration electrode with the second displacement electrode is provided on a surface of the first substrate or the second substrate that faces the first internal space.

According to this configuration, the first penetration electrode and the second penetration electrode are formed in the first substrate. The first penetration electrode is connected to the first displacement electrode. The bump electrode connects the second penetration electrode with the second displacement electrode. Therefore, electrical connection to the first and second displacement electrodes can be secured from outside of the variable wavelength interference filter. Moreover, since these electrodes are formed in a centralized manner on the first substrate side, wiring for connecting each electrode can be simplified and each electrode can easily be mounted on the substrate.

In the variable wavelength interference filter according to the above aspect of the invention, it is preferable that the sealant includes an adhesive, a low-melting glass, or a low-melting metal.

According to this configuration, the sealant for sealing the internal space includes an adhesive, a low-melting glass, or a low-melting metal. Therefore, the quantity of heat transmitted to the variable wavelength interference filter at the time of sealing can be made small and thermal degradation of the mirrors, the electrostatic actuator, the bonding layer and the like in the sealing process can be prevented.

In the variable wavelength interference filter according to the above aspect of the invention, it is preferable that a penetration electrode connected to the pair of displacement electrodes and an electrode forming hole penetrating the first substrate for forming the penetration electrode are formed in the first substrate, that the electrode forming hole also functions as the penetration hole, and that the penetration electrode also functions as the sealant.

According to this configuration, the electrode forming hole for forming the penetration electrode connected to the displacement electrodes also functions as the penetration hole formed in the first substrate, and the penetration electrode also functions as the sealant. With such a configuration, each internal space can be sealed by forming the penetration electrode. Therefore, the forming of the penetration electrode electrically connected with the displacement electrodes and the sealing of each internal space in the reduced-pressure state can be carried out simultaneously. Thus, the process of manufacturing the variable wavelength interference filter can be simplified and the manufacturing efficiency of the variable wavelength interference filter can be improved.

In the variable wavelength interference filter according to the above aspect of the invention, it is preferable that an optical film which reflects or absorbs light of a wavelength outside a specific range is formed on the third substrate.

According to this configuration, since the optical film which reflects or absorbs light of a wavelength outside a specific range is formed on the third substrate, light of a wavelength outside the specific range can be eliminated when light becomes incident on the third substrate. That is, the optical film can function as a band pass filter. Therefore, there is no need to provide a band pass filter separately and the number of components of the variable wavelength interference filter can be reduced. Thus, reduction in size and cost of the variable wavelength interference filter can be realized.

Another aspect of the invention is directed to an optical module including the above variable wavelength interference filter, and a light receiving unit which receives inspection target light transmitted through the variable wavelength interference filter.

According to this aspect of the invention, since responsiveness of the movable mirror of the variable wavelength interference filter can be improved, as in the above aspect of the invention, inspection target light can be received quickly. Moreover, since the substrates can be bonded at atmospheric-pressure, a bonding method using a plasma polymerized film, metal film or the like can be employed and bonding quality between the substrates of the variable wavelength interference filter can be secured.

Still another aspect of the invention is directed to an optical analysis device including the above optical module, and an analytic processing unit which analyzes optical properties of light, based on light received by the light receiving unit of the optical module.

According to this aspect of the invention, since responsiveness of the movable mirror of the variable wavelength interference filter can be improved, as in the above aspect of the invention, the intensity of each color component of inspection target light can be analyzed quickly. Moreover, since the substrates can be bonded at atmospheric-pressure, bonding quality between the substrates of the variable wavelength interference filter can be secured.

Yet another aspect of the invention is directed to a method for manufacturing a variable wavelength interference filter including a light-transmissive first substrate, a light-transmissive second substrate which faces one surface side of the first substrate and is bonded to the first substrate, a light-transmissive third substrate which faces aside of the second substrate opposite to the side where the first substrate is provided and which is bonded to the second substrate, and a first internal space sandwiched by the first substrate and the second substrate and a second internal space sandwiched by the second substrate and the third substrate, wherein a penetration hole through which the first internal space and the second internal space are connected to an exterior space outside the filter is formed, and a sealant which tightly closes the first internal space and the second internal space in a reduced-pressure state below atmospheric pressure is provided. The method includes: bonding the first substrate, the second substrate and the third substrate with each other; reducing pressure below atmospheric pressure in the first internal space and the second internal space via the penetration hole; and sealing the penetration hole with the sealant where the first internal space and the second internal space are in the reduced-pressure state below atmospheric pressure.

According to this aspect of the invention, after the substrates are bonded, the reduced-pressure state below atmospheric pressure is achieved in the first internal space and the second internal space and each internal space is sealed. Therefore, the substrates can be bonded at atmospheric-pressure. Thus, a bonding method using a plasma polymerized film, metal film or the like can be employed and bonding quality between the individual substrates can be improved. Moreover, since a movable portion provided with a mirror is arranged in the internal space of the reduced-pressure state, the action of air resistance on the movable mirror can be prevented and sufficient responsiveness of the movable mirror can be secured.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Hereinafter, a colorimeter device as an optical analysis device of a first embodiment of the invention will be described with reference to the drawings.

1. Overall Configuration of Colorimeter Device

Figure 1:
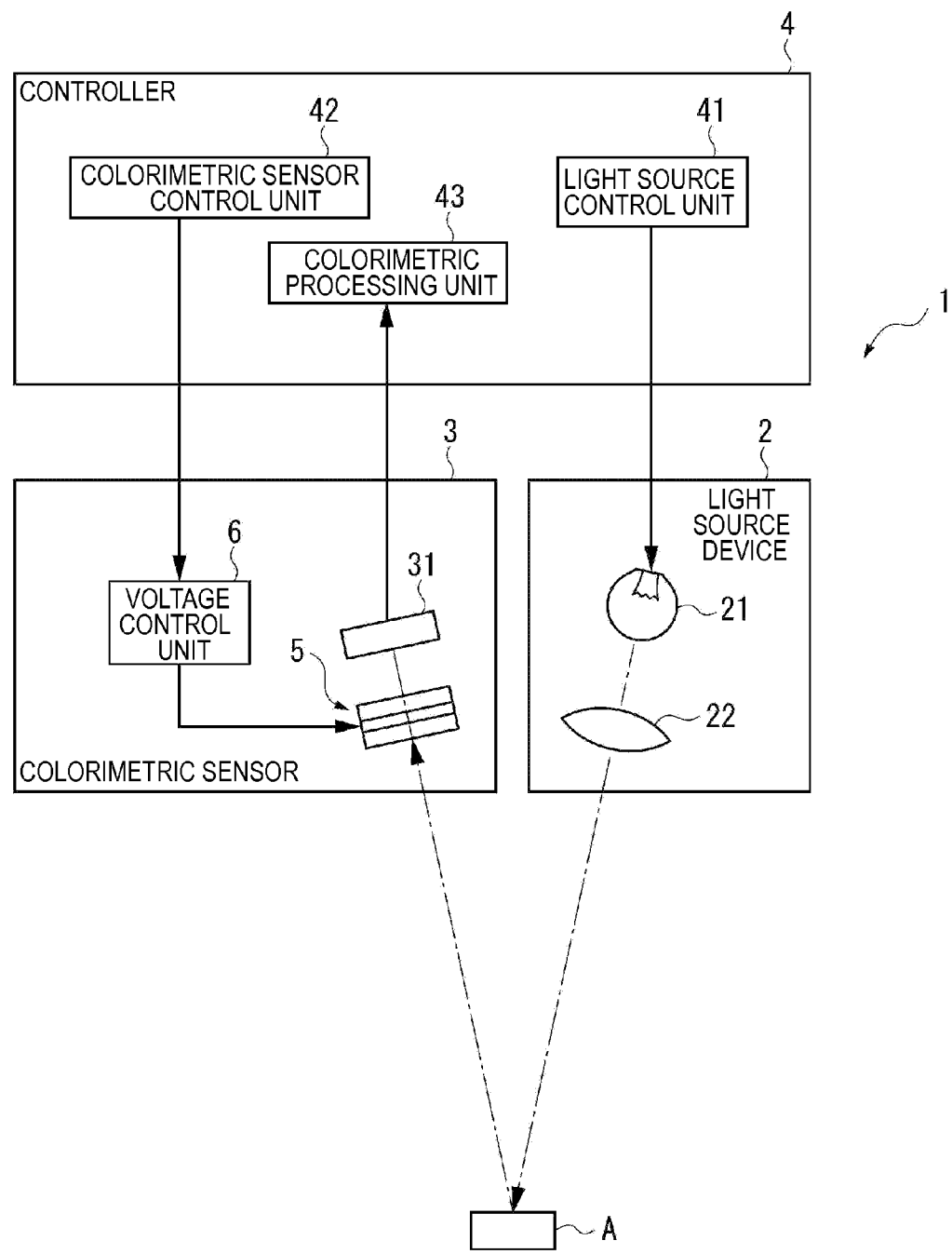
FIG. 1 shows a schematic configuration of a colorimeter device according a first embodiment of the invention.

FIG. 1 shows a schematic configuration of the colorimeter device according to the first embodiment of the invention.

This colorimeter device 1 includes a light source device 2 which emits light to an inspection target A, a colorimetric sensor 3 as an optical module, and a controller 4 which controls overall operation of the colorimeter device 1, as shown in FIG. 1. In this colorimeter device 1, light emitted from the light source device 2 is reflected on the inspection target A and the reflected inspection target light is received by the colorimetric sensor. Based on a detection signal outputted from the colorimetric sensor 3, chromaticity of the inspection target light, that is, the color of the inspection target A, is analyzed and measured.

2. Configuration of Light Source Device

The light source device 2 includes a light source 21 and plural lenses 22 (in FIG. 1, only one lens is shown), and emits white light toward the inspection target A. The plural lenses 22 include a collimating lens. In the light source device 2, white light emitted from the light source 21 is turned into parallel beams by the collimating lens and is then emitted toward the inspection target A from a projection lens, not shown.

3. Configuration of Colorimetric Sensor

The colorimetric sensor 3 includes an etalon 5 constituting a variable wavelength interference filter, a light receiving element 31 as a light receiving unit which receives light transmitted through the etalon 5, and a voltage control unit 6 which varies the wavelength of light to be transmitted at the etalon 5, as shown in FIG. 1. The colorimetric sensor 3 has a light-incident optical lens, not shown, which inwardly guides the reflected light (inspection target light) reflected by the inspection target A, at a position facing the etalon 5. In the colorimetric sensor 3, light with a predetermined wavelength, of the inspection target light incident from the light-incident optical lens, is spectrally separated by the etalon 5 and the separated light is received by the light receiving element 31.

The light receiving element 31 includes plural photoelectric converter elements and generates an electric signal corresponding to the quantity of light received. The light receiving element 31 is connected to the controller 4 and outputs the generated electric signal to the controller 4 as a light receiving signal.

3-1. Configuration of Etalon

Figure 2:
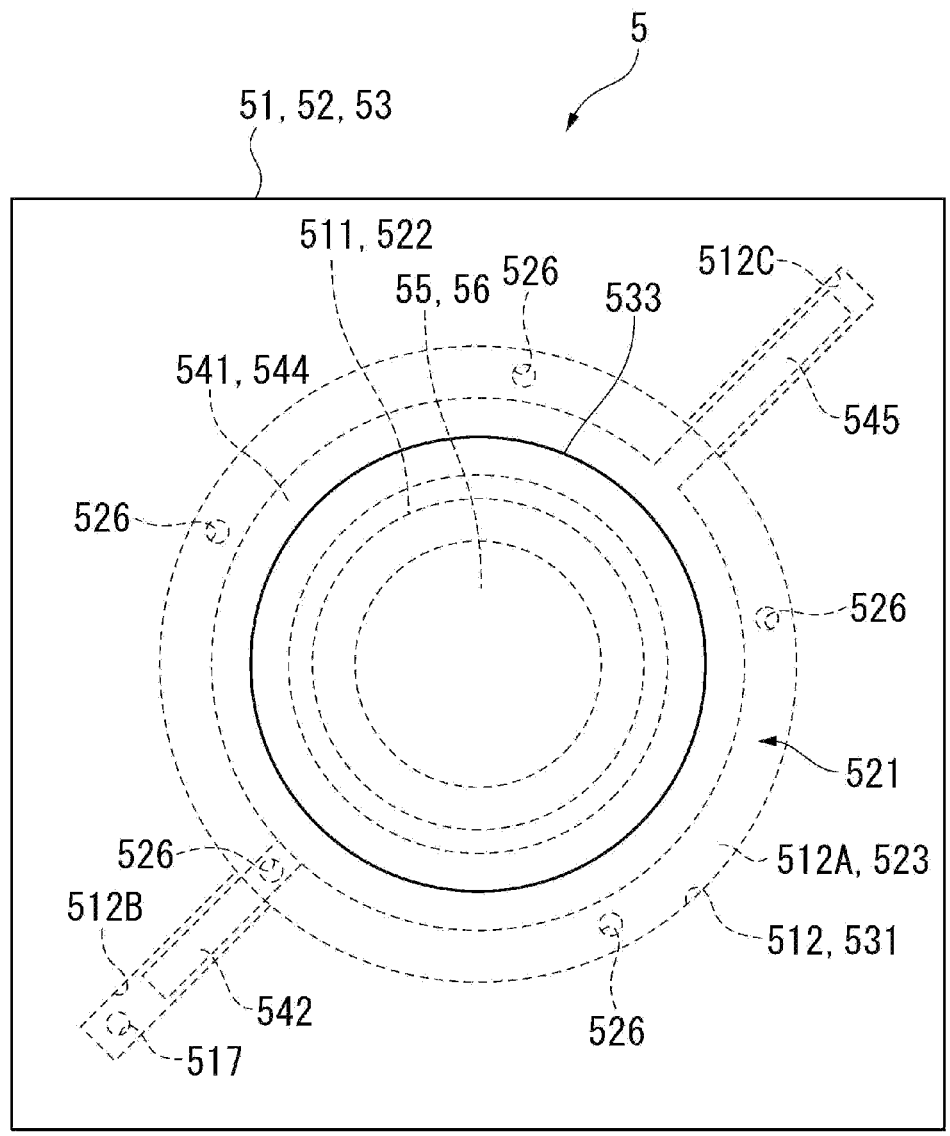
FIG. 2 is a plan view showing a schematic configuration of an etalon which constitutes a variable wavelength interference filter according to the first embodiment.
Figure 3:
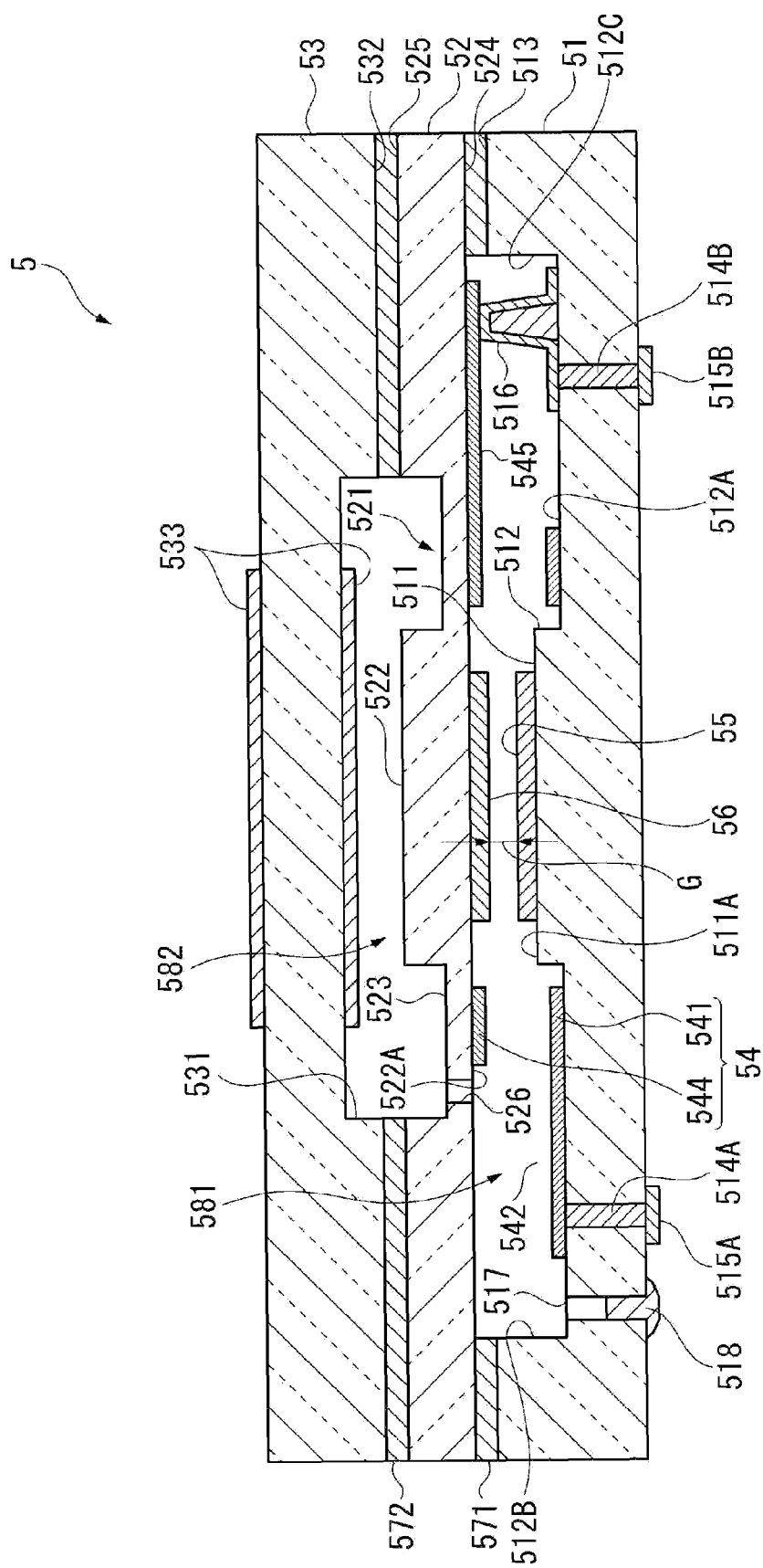
FIG. 3 is a sectional view showing a schematic configuration of the etalon according to the first embodiment.

FIG. 2 is a plan view showing a schematic configuration of the etalon 5 constituting a variable wavelength interference filter. FIG. 3 is a sectional view of the etalon 5. It should be noted that in FIG. 1, inspection target light becomes incident on the etalon 5 from the bottom side of the drawing, whereas in FIG. 3, inspection target light becomes incident from the top side of the drawing.

As shown in FIG. 2, the etalon 5 is an optical member in the shape of a square plate as viewed in a plan view, for example, with one side being 10 mm. As shown in FIG. 3, this etalon 5 includes a first substrate 51, a second substrate 52 and a third substrate 53. Each of these three substrates 51, 52, 53 is made of, for example, various kinds of glass such as soda-lime glass, crystalline glass, quartz glass, lead glass, potassium glass, borosilicate glass, and non-alkaline glass, or crystal and the like. Of these materials, for example, glass containing an alkaline metal such as sodium (Na) or potassium (K) is preferable as the forming material of the substrates 51, 52, 53. As the substrates 51, 52, 53 are made of such glass, tight contact of mirrors 55, 56, which will be described later, and of each electrode, and bonding strength between the substrates can be improved. Moreover, these three substrates 51, 52, 53 are integrally formed as bonding surfaces 513, 524, 525, 532 formed near outer circumferential parts thereof are bonded by bonding layers 571, 572.

Between the first substrate 51 and the second substrate 52, a fixed mirror 55 and a movable mirror 56 forming a pair of mirrors are provided. Here, the fixed mirror 55 is fixed to a surface of the first substrate 51 that faces the second substrate 52. The movable mirror 56 is fixed to a surface of the second substrate 52 that faces the first substrate 51. The fixed mirror 55 and the movable mirror 56 are arranged facing each other via an inter-mirror gap G.

Moreover, an electrostatic actuator 54 for adjusting the inter-mirror gap G between the fixed mirror 55 and the movable mirror 56 is provided between the first substrate 51 and the second substrate 52.

3-1-1. Configuration of First Substrate

Figure 4:
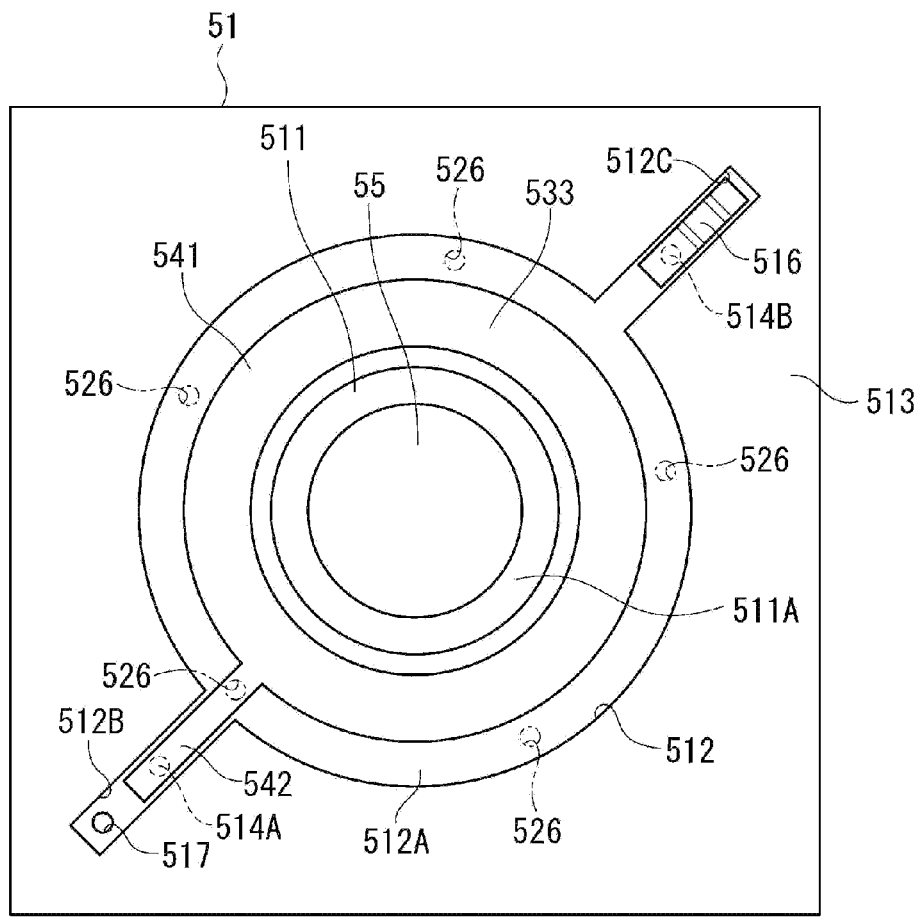
FIG. 4 is a plan view showing a first substrate of the first embodiment, as viewed from the side of a second substrate.

FIG. 4 is a plan view showing the first substrate 51, as viewed from the side of the second substrate 52.

The first substrate 51 is formed by processing a glass base material with a thickness of, for example, 1 mm, by etching. Specifically, as shown in FIG. 3 and FIG. 4, a mirror fixing portion 511 and an electrode forming groove 512 are formed on the first substrate 51 by etching.

The mirror fixing portion 511 is formed in a circular shape centering on the center point of a plane, as viewed in a plan view where the first substrate 51 is viewed from the substrate thickness direction of the first substrate 51. The electrode forming groove 512 is formed in a circular shape concentric with the mirror fixing portion 511 and with a greater diameter dimension than the mirror fixing portion 511, as viewed in the plan view.

The mirror fixing portion 511 is formed to a depth of, for example, 500 nm from the surface of the first substrate 51. The depth dimension of the mirror fixing portion 511 is properly set by the dimension of the inter-mirror gap G between the fixed mirror 55 fixed to the surface (mirror fixing surface 511A) of the mirror fixing portion 511 and the movable mirror formed on the second substrate 52, and the thickness dimensions of the fixed mirror 55 and the movable mirror 56. Also, it is preferable that the depth of the mirror fixing portion 511 is set in consideration of the wavelength range to be transmitted through the etalon 5.

The fixed mirror 55 formed in a circular shape is fixed to the mirror fixing surface 511A. This fixed mirror 55 is a metal alloy film of an Ag alloy, Al alloy or the like having a high reflectance, and is formed on the mirror fixing portion 511 by a technique such as sputtering.

In this embodiment, a metal alloy film of an Ag alloy, Al alloy or the like is used as the fixed mirror 55. However, without being limited to this, for example, a fixed mirror formed by a $TiO_2$—$SiO_2$-based dielectric multilayer film or an AgC single layer may be used.

The electrode forming groove 512 is formed to a depth of, for example, 1 μm from the surface of the first substrate 51. A ring-shaped electrode fixing bottom surface 512A is formed from the outer circumferential edge of the mirror fixing portion 511 to the inner circumferential wall surface of the electrode forming groove 512. A first displacement electrode 541 is formed on this electrode fixing bottom surface 512A. Also, a first electrode introducing groove 512B and a bump electrode forming groove 512C are formed on the first substrate 51, each of which has a groove dimension that is the same depth dimension as the electrode fixing bottom surface 512A. The first electrode introducing groove 512B and the bump electrode forming groove 512C are formed extending from the outer circumferential edge into opposite directions to each other in relation to the center point of the plane of the first substrate 51.

In the first electrode introducing groove 512B, a first displacement electrode lead-out portion 542 extending from a portion of the outer circumferential part of the first displacement electrode 541 is formed. The first displacement electrode 541 and the first displacement electrode lead-out portion 542 are formed using an Au/Cr film (a metal film formed on an underlying chromium film) and are formed to a thickness of, for example, 100 nm by a technique such as sputtering.

In this embodiment, the Au/Cr film is used as the first displacement electrode 541 and the first displacement electrode lead-out portion 542. However, without being limited to this, other metals and ITO (indium tin oxide) may be used.

At the position where the first displacement electrode lead-out portion 542 is provided in the first electrode introducing groove 512B, a first penetration electrode 514A penetrating the first substrate 51 is formed. The first penetration electrode 514A connects the first displacement electrode lead-out portion 542 with a first external terminal 515A provided on the surface of the first substrate 51 that is opposite to the first displacement electrode lead-out portion 542.

In the bump electrode forming groove 512C, a bump electrode 516 including a core of a resin such as polyimide with the periphery thereof plated with gold or the like is formed. In the bump electrode forming groove 512C, a second penetration electrode 514B penetrating the first substrate 51 is formed at a position facing a second displacement electrode 544, which will be described later. The second penetration electrode 514B connects the bump electrode 516 with a second external terminal 515B provided on the surface of the first substrate 51 that is opposite to the bump electrode 516.

The penetration electrodes 514A, 514B are formed by forming penetration holes with a diamond drill or sandblast after the first displacement electrode 541, the first displacement electrode lead-out portion 542 and the bump electrode 516 are formed, and then sealing the penetration holes by plating with gold or the like.

Moreover, a first penetration hole 517 connecting a space outside of the etalon 5 with a light exiting-side space (the first internal space) 581 between the first substrate 51 and the second substrate 52 is formed in the first substrate 51. This first penetration hole 517 is sealed with a sealant 518 where the light exiting-side space 581 and a light incident-side space (the second internal space) 582 between the second substrate 52 and the third substrate 53 are in a reduced-pressure state. As the sealant 518, an adhesive, low-melting glass, low-melting metal or the like is used.

3-1-2. Configuration of Second Substrate

The second substrate 52 is formed by processing a glass base material with a thickness of, for example, 600 μm, by etching.

Specifically, as shown in FIG. 2 and FIG. 3, a displaced portion 521 is formed by etching on the second substrate 52. This displaced portion 521 has a circular movable portion 522 centering on the center point of a plane, as viewed in a plan view where the second substrate 52 is viewed from the substrate thickness direction of the second substrate 52, and a connection holding portion 523 which is coaxial with the movable portion 522 and holds the movable portion 522.

The movable portion 522 is formed to a greater thickness dimension than the connection holding portion 523. For example, in this embodiment, the movable portion 522 is formed to 600 μm, which is the same dimension as the thickness dimension of the second substrate 52. The movable portion 522 is formed in a columnar shape with substantially the same diameter dimension as the diameter dimension of the mirror fixing portion 511. The movable portion 522 also has a movable surface 522A parallel to the mirror fixing portion 511. The movable mirror 56 is fixed to the movable surface 522A. Here, the movable mirror 56 and the above fixed mirror 55 form a pair of mirrors.

The movable mirror 56 is formed in a circular shape similarly to the fixed mirror 55. As the movable mirror 56, the same thin film as the fixed mirror 55 is used. In this embodiment, a metal alloy film of an Ag alloy, Al alloy or the like is used.

The connection holding portion 523 is a diaphragm surrounding the periphery of the movable portion 522 and is formed to a thickness dimension of, for example, 30 μm. On a surface of the connection holding portion 523 that faces the first substrate 51, a ring-shaped second displacement electrode 544 facing the first displacement electrode 541 via an electromagnetic gap is formed. Here, the dimension of the electromagnetic gap is decided according to the depth dimension of the electrode forming groove 512 in the first substrate 51, the thicknesses of the displacement electrodes 541, 544, and the thickness of the bonding layer 571. The second displacement electrode 544 and the above first displacement electrode 541 are the pair of displacement electrodes and form the electrostatic actuator 54.

A second displacement electrode lead-out portion 545 is formed extending from a portion of the outer circumferential edge of the second displacement electrode 544 toward one of the vertices of the square second substrate 52 as viewed in a plan view, more specifically, toward the top right vertex in the plan view of FIG. 2.

In this embodiment, the second displacement electrode 544 and the second displacement electrode lead-out portion 545 are formed using an Au/Cr film, similarly to the first displacement electrode 541 and the first displacement electrode lead-out portion 542. However, without being limited to this, other metals and ITO may be used.

Moreover, in the connection holding portion 523 of the second substrate 52, a second penetration hole 526 connecting the light exiting-side space 581 between the first substrate 51 and the second substrate 52 to the light incident-side space 582 between the second substrate 52 and the third substrate 53 is formed. This second penetration hole 526 is formed in advance by laser processing or the like.

When the second substrate 52 and the first substrate 51 are bonded together, the second displacement electrode lead-out portion 545 abuts on the bump electrode 516 formed on the first substrate 51 and this abutting state is maintained. That is, the second displacement electrode lead-out portion 545 is connected to the second external terminal 515B via the bump electrode 516 and the second penetration electrode 514B. Thus, electrical connection from the second displacement electrode lead-out portion 545 to the second external terminal 515B is secured. The second external terminal 515B and the above first external terminal 515A are connected, for example, to the voltage control unit 6 of the colorimetric sensor 3. A predetermined voltage is applied between the first displacement electrode 541 and the second displacement electrode 544 by the voltage control unit 6. Thus, the first displacement electrode 541 and the second displacement electrode 544 are pulled by electrostatic attraction, the connection holding portion 523 flexes, and the movable portion 522 is displaced toward the first substrate 51. By controlling the voltage applied between the first displacement electrode 541 and the second displacement electrode 544, the inter-mirror gap G between the movable mirror 56 on the movable portion 522 and the fixed mirror 55 on the first substrate 51 is adjusted. Thus, light of a wavelength corresponding to the inter-mirror gap G can be spectrally separated.

3-1-3. Configuration of Third Substrate

The third substrate 53 is formed by processing a glass base material, for example, with a thickness of 1 mm by etching, as in the case of the first substrate 51 and the second substrate 52. Specifically, on the third substrate 53, a gap forming groove 531 facing the displaced portion 521 on the second substrate 52 and having the same diameter dimension as the displaced portion 521 is formed.

On both sides of the third substrate 53, an optical film 533 which reflects or absorbs light of a wavelength outside a specific range is formed concentrically with the fixed mirror 55 and the movable mirror 56. Inspection target light incident from the light-incident optical lens of the colorimetric sensor 3 passes through the optical film 533 and becomes incident on the movable portion 522 on the second substrate 52.

The first substrate 51, the second substrate 52 and the third substrate 53 as described above are formed as an integrated configuration, by having the bonding surfaces 513, 524, 525, 532 on the outer circumferential side of the displaced portion 521 bonded together, as shown in FIG. 3.

3-2. Configuration of Voltage Control Unit

The voltage control unit 6, together with the etalon 5, forms a variable wavelength interference filter. The voltage control unit 6 controls the voltage applied to the first displacement electrode 541 and the second displacement electrode 544 of the electrostatic actuator 54, based on a control signal inputted from the controller 4.

4. Configuration of Controller

The controller 4 controls overall operation of the colorimeter device 1.

As the controller 4, for example, a general-purpose personal computer, personal digital assistant, computer for colorimetry or the like can be used.

The controller 4 includes a light source control unit 41, a colorimetric sensor control unit 42, a colorimetric processing unit 43 as an analytic processing unit and the like, as shown in FIG. 1.

The light source control unit 41 is connected to the light source device 2. The light source control unit 41 outputs a predetermined control signal to the light source device 2, for example, based on user's setting input, and thus causes the light source device 2 to emit white light of predetermined brightness.

The colorimetric sensor control unit 42 is connected to the colorimetric sensor 3. The colorimetric sensor control unit 42 sets a wavelength of light to be received by the colorimetric sensor 3, for example, based on user's setting input, and outputs to the colorimetric sensor 3 a control signal indicating that the quantity of light received with this wavelength should be detected. Thus, based on the control signal, the voltage control unit 6 of the colorimetric sensor 3 sets an applied voltage to the electrostatic actuator 54 so that the wavelength of light desired by the user will be transmitted.

The colorimetric processing unit 43 outputs the quantity of light received of each wavelength component constituting the inspection target light to a display device such as a display or a printing device such as a printer, and performs control to display the value of each color component constituting the inspection target light.

5. Method for Manufacturing Etalon

First, the above substrates 51, 52, 53 are formed. At this time, each of the first penetration hole 517 in the first substrate 51 and the second penetration hole 526 in the second substrate 52 is formed in advance by laser processing or the like. The first substrate 51 and the third substrate 53 are formed to a thickness that can secure rigidity to such an extent that the substrates do not flex when a reduced-pressure state is achieved in the light exiting-side space 581 and the light incident-side space 582.

Next, the substrates 51, 52, 53 are bonded to each other. Here, for example, plasma polymerized films are used as the bonding layers 571, 572 which bond the bonding surfaces 513, 524, 525, 532 to each other. Specifically, plasma polymerized films are formed on the bonding surfaces 513, 524, 525, 532 of the substrates 51, 52, 53 by plasma polymerization or the like. After the plasma polymerized films are irradiated with ultraviolet rays or plasma-processed, the substrates 51, 52, 53 are superimposed and bonded. Preferably, the plasma polymerized films use polyorganosiloxane as a principal material, and the average thickness thereof is approximately 10 nm to approximately 100 nm.

As activated bonding using the siloxane-based plasma polymerized films is carried out, the plasma polymerized films can be bonded easily by ultraviolet irradiation or plasma processing, irrespective of temperature. Moreover, as the siloxane-based plasma polymerized films are used, sufficiently tight contact and high bonding strength can be achieved no matter what material is used for the substrates 51, 52, 53.

Also, for bonding the substrates 51, 52, 53, for example, a bonding method using an adhesive thin film (adhesive) or a bonding method using a metal film can be used as well as the above bonding method.

After the substrates 51, 52, 53 are bonded to each other, the air in the light exiting-side space 581 and the light incident-side space 582 is evacuated through the first penetration hole 517 by a suction device such as a vacuum pump, thus achieving a reduced-pressure state below atmospheric pressure in the light exiting-side space 581 and the light incident-side space 582. Then, with the light exiting-side space 581 and the light incident-side space 582 being in the reduced-pressure state, the first penetration hole 517 is sealed with the sealant 518.

6. Advantages and Effects of First Embodiment

As described above, in the etalon 5 according to the first embodiment, the first penetration hole 517, which connects the light exiting-side space 581 sandwiched by the first substrate 51 and the second substrate 52 to an outside space, is formed in the first substrate 51. Also, the second penetration hole 526, which connects the light incident-side space 582 sandwiched by the second substrate 52 and the third substrate 53 to the light exiting-side space 581, is formed in the second substrate 52.

Therefore, since a reduced-pressure state below atmospheric pressure can be achieved in the light exiting-side space 581 and the light incident-side space 582 via the first penetration hole 517, the light exiting-side space 581 and the light incident-side space 582 can be sealed in the reduced-pressure state after the substrates 51, 52, 53 are bonded. Thus, since the substrates 51, 52, 53 can be bonded at atmospheric-pressure, a bonding method using a plasma polymerized film, metal film or the like can be employed and bonding quality between the substrates 51, 52, 53 can be secured. Particularly, since plasma polymerized films as an example of the bonding layers 571, 572 can absorb irregularities on the surfaces of the substrates 51, 52, 53, the substrates 51, 52, 53 can be bonded to each other in a tightly closed state and high bonding quality can be achieved. Thus, the invention, which enables bonding of substrates using plasma polymerized films, has significant advantages.

Also, the light exiting-side space 581 and the light incident-side space 582 can be sealed in the reduced-pressure state by only sealing the first penetration hole 517. Therefore, a small number and amount of the sealants 518 suffices.

Moreover, the movable portion 522 on which the movable mirror 56 is provided is arranged between the light exiting-side space 581 and the light incident-side space 582, each being in the reduced-pressure state. Therefore, the action of air resistance on the movable mirror 56 can be prevented at the time of driving. Thus, the responsiveness of the movable mirror 56 can be improved and sufficient responsiveness of the movable mirror 56 can be secured.

Also, in the colorimetric sensor 3 and the colorimeter device 1 using such an etalon 5, the responsiveness of the movable mirror 56 of the etalon 5 can be improved. Therefore, inspection target light can be received quickly and the intensity of each color component of the inspection target light can be analyzed quickly.

Second Embodiment

Next, a variable wavelength interference filter according to a second embodiment of the invention will be described.

Figure 5:
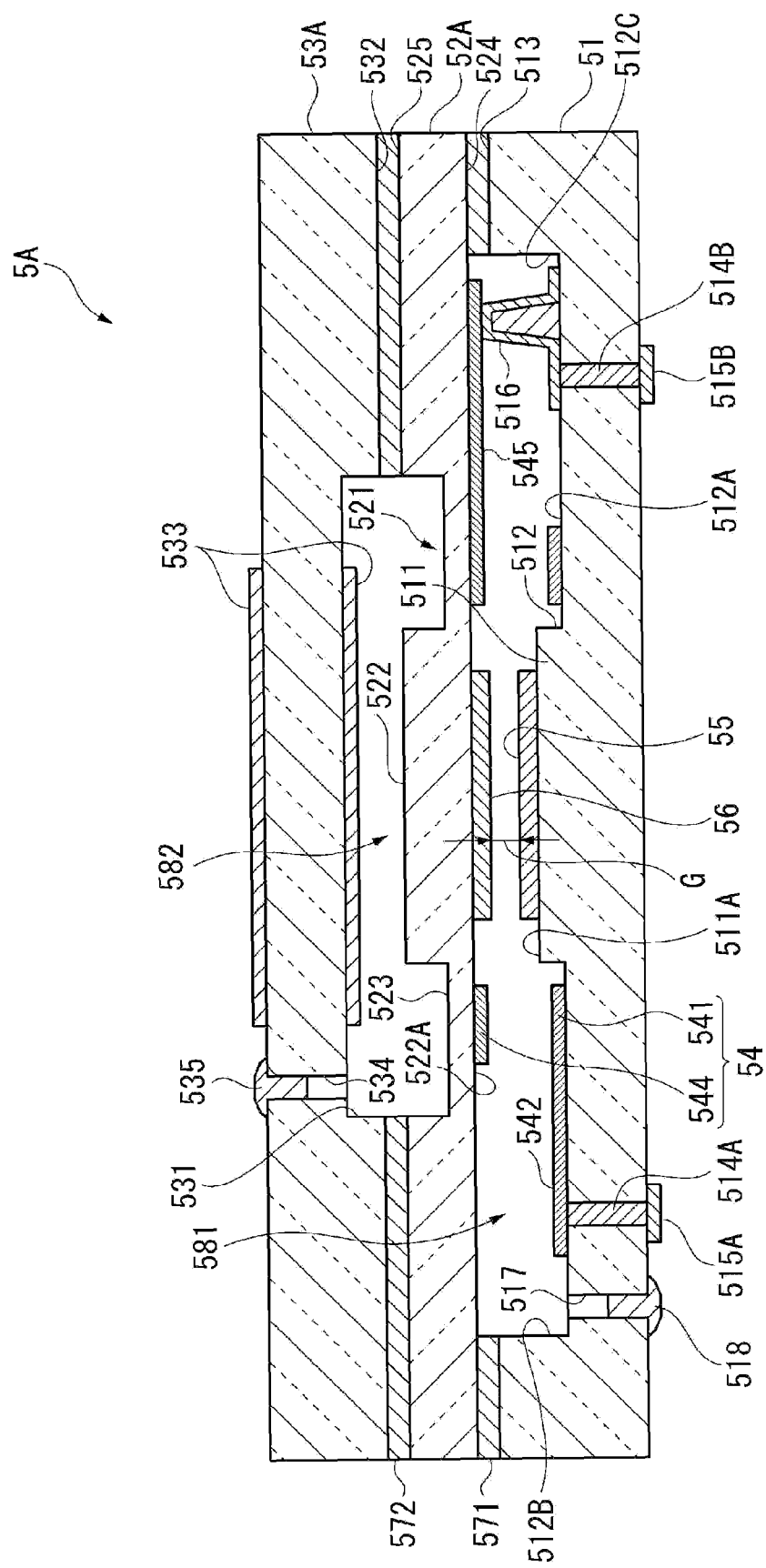
FIG. 5 is a sectional view showing a schematic configuration of an etalon according to a second embodiment.

FIG. 5 is a sectional view showing a schematic configuration of an etalon according to the second embodiment. In the following description of the second embodiment, the same components of the configuration in the first embodiment are denoted by the same reference numerals and the description thereof will be omitted or simplified.

The colorimeter device of the second embodiment has substantially the same configuration as in the first embodiment and includes the light source device 2, the colorimetric sensor 3, and the controller 4. The second embodiment is different from the first embodiment in the configuration of an etalon 5A provided in the colorimetric sensor 3.

That is, in the etalon 5 of the first embodiment, the second penetration hole 526 is provided in the second substrate 52, whereas in the etalon 5A of the second embodiment, the second penetration hole 526 is not formed in a second substrate 52A, and a third penetration hole 534 is formed in a third substrate 53A. The third penetration hole may alternatively be referred to as "another penetration hole" or "a second penetration hole".

Specifically, in the etalon 5A of the second embodiment, as shown in FIG. 5, the third penetration hole 534 is formed in the gap forming groove 531 of the third substrate 53A. The third penetration hole 534 connects the space outside of the etalon 5A to the light incident-side space 582 between the second substrate 52A and the third substrate 53A. The third penetration hole 534 is sealed with a sealant 535 where the light incident-side space 582 is in a reduced-pressure state below atmospheric pressure.

Such an etalon 5A can be formed by the following manufacturing method.

That is, after the substrates 51, 52A, 53A are bonded to each other, the air in the light exiting-side space 581 and the light incident-side space 582 is evacuated by a suction device such as a vacuum pump via the penetration holes 517, 534. Thus, a reduced-pressure state is achieved in the light exiting-side space 581 and the light incident-side space 582. In this state, the penetration holes 517, 534 are sealed with the sealants 518, 535, thereby sealing the light exiting-side space 581 and the light incident-side space 582 in the reduced-pressure state. Thus, the etalon 5A is formed.

Advantages and Effects of Second Embodiment

The etalon 5A of the second embodiment can achieve the following advantages and effects.

That is, the first penetration hole 517 connected to the light exiting-side space 581 is formed in the first substrate, and the third penetration hole 534 connected to the light incident-side space 582 is formed in the third substrate 53A. Therefore, the air in the light exiting-side space 581 and the light incident-side space 582 can be evacuated separately. Thus, since the air in the light exiting-side space 581 and the light incident-side space 582 can be evacuated simultaneously, the time for achieving the reduced-pressure state in the light exiting-side space 581 and the light incident-side space 582 can be reduced and the manufacturing efficiency of the etalon 5A can be improved. Particularly when the formation of the second penetration hole 526 at the connection holding portion 523 shown in the first embodiment is difficult because of rigidity or some other reason, the reduced-pressure state can be achieved in the light incident-side space 582 by forming the third penetration hole 534 in the third substrate 53A, as in the etalon 5A of this embodiment.

Third Embodiment

Next, a variable wavelength interference filter according to a third embodiment of the invention will be described.

Figure 6:
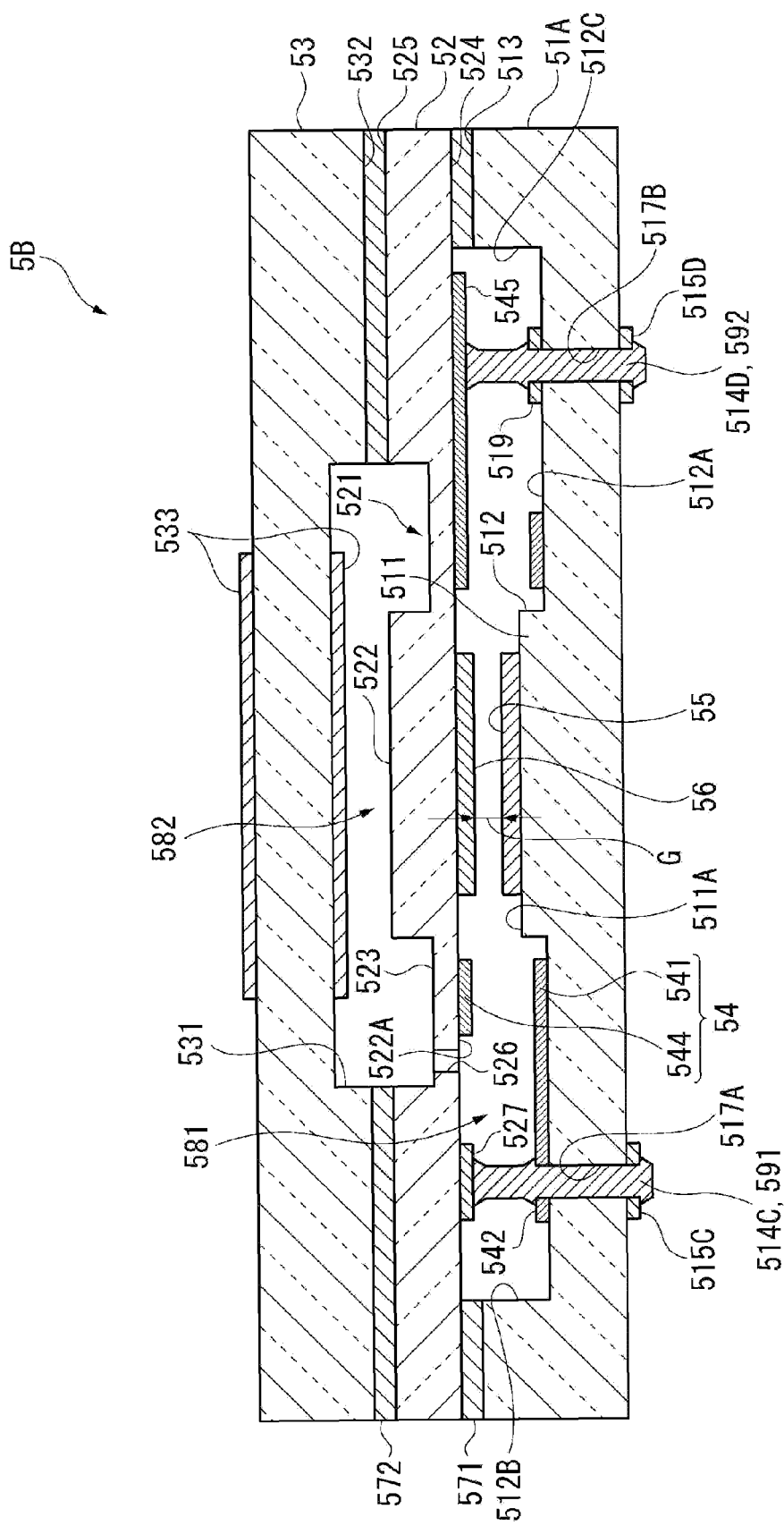
FIG. 6 is a sectional view showing a schematic configuration of an etalon according to a third embodiment.

FIG. 6 is a sectional view showing a schematic configuration of an etalon according to the third embodiment.

Figure 7:
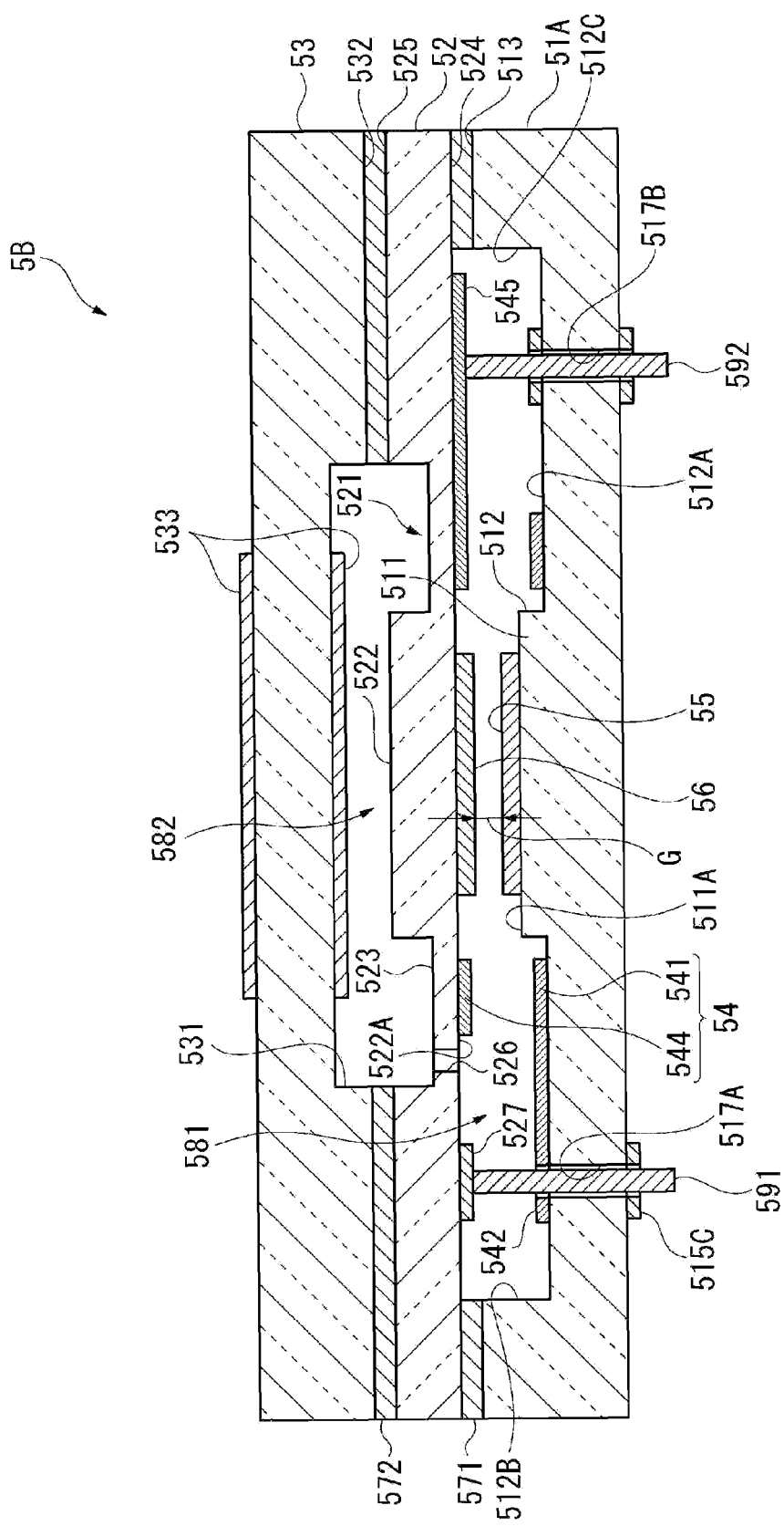
FIG. 7 shows a process of sealing an internal space of the etalon according to the third embodiment.

FIG. 7 is a schematic view for explaining a process of sealing an internal space of the etalon of the third embodiment.

In the first embodiment, the penetration holes 517, 526 connecting the light exiting-side space 581 to an outside space are provided separately from the holes for forming the penetration electrodes 514A, 514B, and the first penetration hole 517 is sealed where the light incident-side space 582 and the light exiting-side space 581 are in a reduced-pressure state. The bump electrode 516 is formed, and the displacement electrodes 541, 544 are connected to the external terminals 515A, 515B via the penetration electrodes 514A, 514B and the bump electrode 516.

Meanwhile, in the third embodiment, a first electrode forming hole 517A and a second electrode forming hole 517B penetrating a first substrate 51A are formed for forming penetration electrodes 514C, 514D. The penetration electrodes 514C, 514D are formed in the electrode forming holes 517A, 517B. Thus, the light incident-side space 582 and the light exiting-side space 581 are sealed in the reduced-pressure state and the penetration electrodes 514C, 514D are formed.

Specifically, as shown in FIG. 6, the first displacement electrode 541, the first displacement electrode lead-out portion 542, a first external terminal 515C, the first electrode forming hole 517A and the first penetration electrode 514C are formed on the first substrate 51A. Each of the first displacement electrode lead-out portion 542 and the first external terminal 515C has an electrode forming hole with substantially the same diameter dimension as the first electrode forming hole 517A. The first electrode forming hole 517A is formed in a straight line (coaxially) with the electrode forming holes of the first displacement electrode 541 and the first external terminal 515C, at the position where the first displacement electrode 541 is provided on the first substrate 51A. The first penetration electrode 514C penetrates these electrode forming holes and is connected with the first displacement electrode lead-out portion 542 and with a dummy electrode 527 on the second substrate 52, which will be described later.

Also, a dummy electrode 519, a second external terminal 515D, the second electrode forming hole 517B and the second penetration electrode 514D are formed in the first substrate 51A. Each of the dummy electrode 519 and the second external terminal 515D has an electrode forming hole with substantially the same diameter dimension as the second electrode forming hole 517B. The second electrode forming hole 517B is formed in a straight line (coaxially) with the electrode forming holes of the dummy electrode 519 and the second external terminal 515D, at a position facing the second displacement electrode 544. The second penetration electrode 514D penetrates these electrode forming holes and is connected with the second displacement electrode lead-out portion 545 on the second substrate 52.

Hereinafter, a method of sealing the light incident-side space 582 and the light exiting-side space 581 in the etalon 5B of this embodiment, and a method for connecting the external terminals 515C, 515D with the displacement electrode lead-out portions 542, 545 will be described.

First, the first displacement electrode 541, the first displacement electrode lead-out portion 542, the external terminals 515C, 515D and the dummy electrode 519 are formed on the first substrate 51A. Also, the second displacement electrode 544, the second displacement electrode lead-out portion 545 and the dummy electrode 527 are formed on the second substrate 52. The dummy electrodes 519, 527 are not involved in driving and are provided to secure tight contact between the penetration electrodes 514C, 514D and the first substrate 51A and tight closing of the light exiting-side space 581.

Then, the electrode forming holes including the electrode forming holes 517A, 517B are formed in the external terminals 515C, 515D, the first substrate 51A, the first displacement electrode lead-out portion 542 and the dummy electrode 519 by a diamond drill or sandblast or the like.

Next, the substrates 51A, 52, 53 are bonded via the bonding layers 571, 572. After that, as shown in FIG. 7, low-melting metal wires 591, 592 with a predetermined length are inserted into the electrode forming holes including the electrode forming holes 517A, 517B, and the distal ends of the low-melting metal wires 591, 592 are made to abut on the dummy electrode 527 or the second displacement electrode lead-out portion 545. Then, the etalon 5B is placed in a vacuum chamber, not shown, and the pressure in the vacuum chamber is reduced. At this time, the electrode forming holes 517A, 517B function as the first penetration holes 517A, 517B for achieving a reduced-pressure state in the light exiting-side space 581 and the light incident-side space 582.

In this state, the inside of the vacuum chamber is heated to a temperature at which the low-melting metal wires 591, 592 melt. After the inside of the vacuum chamber is cooled and returned to atmospheric pressure, the etalon 5B is taken out of the chamber. Thus, the low-melting metal wires 591, 592 are molten and the light incident-side space 582 and the light exiting-side space 581 are sealed in the reduced-pressure state, as shown in FIG. 6. Also, the penetration electrodes 514C, 514D are formed in the electrode forming holes 517A, 517B. The displacement electrode lead-out portions 542, 545 and the external terminals 515C, 515D are connected with each other by the penetration electrodes 514C, 514D.

Advantages and Effects of Third Embodiment

In the etalon 5B of the third embodiment, the low-melting metal wire 591, which is inserted in the first electrode forming hole 517A penetrating the first substrate 51A and abuts on the first displacement electrode 541, and the low-melting metal wire 592, which is inserted in the second electrode forming hole 517B penetrating the first substrate 51A and abuts on the second displacement electrode lead-out portion 545, are melted, thus sealing the electrode forming holes 517A, 517B. With such a configuration, the electrode forming holes 517A, 517B for forming the penetration electrodes 514C, 514D also function as the first penetration holes 517A, 517B for achieving the reduced-pressure state in the light exiting-side space 581 and the light incident-side space 582, and the penetration electrodes 514C, 514D also function as the sealant 518. Therefore, forming the penetration electrodes 514C, 514D electrically connected with the displacement electrodes 541, 544 and sealing the light exiting-side space 581 and the light incident-side space 582 in the reduced-pressure state can be carried out simultaneously. Thus, the manufacturing process of the etalon 5B can be simplified and the manufacturing efficiency of the etalon 5B can be improved.

Since the displacement electrodes 541, 544, and the penetration electrodes 514C, 514D electrically connected with the displacement electrodes 541, 544 are formed in a centralized manner on the side of the first substrate 51A, wiring for connecting each electrode can be simplified and each electrode can easily be mounted on the substrate.

Other Embodiments

The invention is not limited to the above embodiments and includes various modifications, improvements and the like within a range that enables achievement of the objects of the invention.

For example, in the first embodiment, the first penetration hole 517 is formed in the first substrate 51. However, the third penetration hole 534 may be formed in the third substrate 53, without providing the first penetration hole 517 in the first substrate 51. Since the second penetration hole 526 connecting the light exiting-side space 581 with the light incident-side space 582 is formed in the second substrate 52, also in this case, the air in the light exiting-side space 581 and the light incident-side space 582 can be evacuated through the third penetration hole and a reduced-pressure state can be achieved in the light exiting-side space 581 and the light incident-side space 582.

In the first and second embodiments, the bump electrode 516 is formed on the first substrate 51. However, the bump electrode 516 may be formed on the second substrate 52, 52A. This is because if the bump electrode 516 is provided on the surface of the first substrate 51 or the second substrate 52, 52A that faces the light exiting-side space 581, the second displacement electrode 544 and the second penetration electrode 514B can be connected with each other by the bump electrode 516.

In the third embodiment, the external terminals 515C, 515D and the electrode forming holes 517A, 517B are formed in the first substrate 51A. However, without being limited to this, for example, the external terminals 515C, 515D may be provided on the surface of the third substrate 53 opposite to the second substrate 52, and electrode forming holes may be formed to penetrate the external terminals 515C, 515D, the third substrate 53, the second substrate 52, the dummy electrode 527 and the second displacement electrode lead-out portion 545. In this case, the low-melting metal wires 591, 592 are inserted into the electrode forming holes, and the low-melting metal wires 591, 592 are melted with the distal ends thereof abutting on the first displacement electrode lead-out portion 542 or the dummy electrode 519. Thus, the light exiting-side space 581 and the light incident-side space 582 can be sealed in a reduced-pressure state. Moreover, penetration electrodes which connect the displacement electrode lead-out portions 542, 545 with the external terminals 515C, 515D are formed.

In the third embodiment, the second penetration hole 526 is formed in the second substrate 52. However, the third penetration hole 534 may be formed in the third substrate 53, without forming the second penetration hole 526 in the second substrate 52, as in the second embodiment.

Moreover, though the dummy electrodes 519, 527 are provided in the third embodiment, the dummy electrodes 519, 527 are not essential and the penetration electrodes 514C, 514D may be formed without providing the dummy electrodes 519, 527.

In the above embodiments, the displaced portion 521 formed in the second substrate 52, 52A has the diaphragm-like connection holding portion 523. However, without being limited to this, for example, the connection holding portions 523 may be provided at equal intervals on an outer circumferential portion of the movable portion 522, as viewed in a plan view where the etalon 5, 5A, 5B is viewed from the substrate thickness direction. Alternatively, a pair of thin plate-like connection holding portions 523 may be formed on both side of the movable portion 522, with point symmetry about the center point of the movable portion 522.

Also, similar modifications may apply to the displacement electrodes. For example, the displacement electrodes may be provided at positions that enable even displacement of the movable portion 522. For example, a pair of first displacement electrodes 541 may be formed at point symmetry positions on both side of the fixed mirror 55 on the first substrate 51, and a pair of second displacement electrodes 544 may be formed on the connection holding portion 523 of the second substrate 52, facing the first displacement electrodes 541. The electrostatic actuator 54 may be formed by these electrodes.

Moreover, in the above embodiments, the colorimeter device 1 has the light source device 2, and white light emitted from the light source device 2 is reflected by an inspection target and the reflected light is received by the colorimetric sensor as inspection target light. However, a colorimeter device which emits light by itself and measures chromaticity of an inspection target, such as a liquid crystal display, may be configured without having the light source device 2.

Also, instead of the configurations having the single etalon 5, 5A, 5B incorporated in the colorimetric sensor 3, configurations having plural etalons 5, 5A, 5B incorporated therein may be employed. In such a case, a broader range can be covered by incorporating the etalons 5, 5A, 5B with different spectrally separable wavelength ranges from each other.

Furthermore, specific structures and procedures for carrying out the invention can be suitably changed to other structures and the like within a range that enables achievement of the objects of the invention.

The entire disclosure of Japanese Patent Application No. 2011-026146 filed Feb. 9, 2011 is incorporated by reference.

What is claimed is:
1. A variable wavelength interference filter comprising:
a first substrate;
a second substrate having a first surface and an opposite second surface, the second substrate being bonded to the first substrate by a bonding layer so that the first surface faces the first substrate and a first internal space is sandwiched therebetween;
a third substrate bonded to the second substrate by another bonding layer so as to face the second surface and sandwich a second internal space therebetween;
a movable portion provided in the second substrate and having a movable surface that faces the first substrate;
a connection holding portion provided in the second substrate and holding the movable portion so that the movable portion is movable in a substrate thickness direction, a thickness of the connection holding portion being less than a thickness of the movable portion;
a pair of mirrors respectively provided on the movable surface of the movable portion and a surface of the first substrate facing the second substrate so that the movable mirrors face each other across an inter-mirror gap; and
an electrostatic actuator which has a pair of displacement electrodes facing each other, the pair of electrodes being respectively provided on the surface of the first substrate and the first surface of the second substrate,
wherein a first penetration hole is formed through the first substrate;
a second penetration hole is formed through the connection holding portion, and connects the first internal space with the second internal space;
the first penetration hole is sealed with a sealant,
the pair of displacement electrodes includes a first displacement electrode provided on the first substrate and a second displacement electrode provided on the second substrate,
a first penetration electrode penetrating the first substrate and connected to the first displacement electrode,
a second penetration electrode penetrating the first substrate is formed through the first substrate, and
a bump electrode connecting the second penetration electrode with the second displacement electrode is pro- vided on the surface of the first substrate or the first surface of the second substrate.

2. The variable wavelength interference filter according to claim 1, wherein the penetration hole includes:
a first penetration hole formed in the first substrate and connecting the first internal space to the space outside of the filter; and
a second penetration hole formed in the third substrate and connecting the second internal space to the space outside of the filter, and
the first penetration hole and the second penetration hole are sealed with the sealant.

3. The variable wavelength interference filter according to claim 1, wherein the sealant includes an adhesive, a low-melting glass, or a low-melting metal.

4. The variable wavelength interference filter according to claim 1, wherein the sealant is a penetration electrode connected to the pair of displacement electrodes, and the penetration hole is an electrode forming hole penetrating the first substrate and having the penetration electrode therein.

5. The variable wavelength interference filter according to claim 1, wherein an optical film which reflects or absorbs light having a wavelength outside of a specific range is formed on the third substrate.

6. An optical module comprising:
the variable wavelength interference filter according to claim 1; and
a light receiving unit which receives inspection target light transmitted through the variable wavelength interference filter.

7. An optical analysis device comprising:
the optical module according to claim 6; and
an analytic processing unit which analyzes optical properties of light, based on light received by the light receiving unit of the optical module.

8. The interference filter according to claim 1, wherein a width of the second penetration hole in a cross-sectional view is less than a width of the connection holding portion in the cross-sectional view.

9. A variable wavelength interference filter comprising:
a first substrate;
a second substrate bonded to the first substrate by a bonding layer;
a third substrate bonded to the second substrate by another bonding layer so as to sandwich the second substrate between the first and third substrates;
a movable portion provided in the second substrate;
a connection holding portion provided in the second substrate and holding the movable portion so that the movable portion is movable in a substrate thickness direction, a thickness of the connection holding portion being less than a thickness of the movable portion;
an electrostatic actuator which has a pair of displacement electrodes facing each other, the pair of electrodes being respectively provided on surfaces of the first and second substrates that face each other; and
a first internal space between the first substrate and the second substrate, and a second internal space between the second substrate and the third substrate,
wherein a first penetration hole is provided through the first substrate,
a second penetration hole is formed through the connection holding portion of the second substrate, and connects the first internal space with the second internal space;
the first penetration hole is sealed with a sealant which closes the first internal space and the second internal space in a reduced-pressure state below atmospheric pressure,
the pair of displacement electrodes includes a first ds lace en electrode provided on the first substrate and a second displacement electrode provided on the second substrate,
a first penetration electrode penetrating the first substrate and connected to the first displacement electrode, and a second penetration electrode penetrating the first substrate is formed through the first substrate, and
a bump electrode connecting the second penetration electrode with the second displacement electrode is provided on the surface of the first substrate of the first surface of the second substrate.

10. The interference filter according to claim 9, wherein a width of the second penetration hole in a cross-sectional view is less than a width of the connection holding portion in the cross-sectional view.

* * * * *